United States Patent
Sato et al.

(10) Patent No.: US 12,469,826 B2
(45) Date of Patent: *Nov. 11, 2025

(54) SEMICONDUCTOR MODULE

(71) Applicant: FUJI ELECTRIC CO., LTD., Kawasaki (JP)

(72) Inventors: Tadahiko Sato, Kawasaki (JP); Kenichiro Sato, Kawasaki (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 49 days.

This patent is subject to a terminal disclaimer.

(21) Appl. No.: 18/348,770

(22) Filed: Jul. 7, 2023

(65) Prior Publication Data
US 2023/0352453 A1    Nov. 2, 2023

Related U.S. Application Data

(62) Division of application No. 17/187,588, filed on Feb. 26, 2021, now Pat. No. 11,742,333.

(30) Foreign Application Priority Data

Mar. 27, 2020 (JP) ................. 2020-057337

(51) Int. Cl.
*H01L 23/498* (2006.01)
*H01L 23/00* (2006.01)
(Continued)

(52) U.S. Cl.
CPC ...... *H01L 25/072* (2013.01); *H01L 23/49822* (2013.01); *H01L 23/50* (2013.01);
(Continued)

(58) Field of Classification Search
CPC ....... H01L 25/072; H01L 24/32; H01L 24/40; H01L 23/49811
See application file for complete search history.

(56) References Cited

U.S. PATENT DOCUMENTS 11,742,333 B2* 8/2023 Sato ................ H01L 24/40
                                                  257/668
2015/0287665 A1  10/2015 Hanada
2018/0182694 A1   6/2018 Soyano

FOREIGN PATENT DOCUMENTS

EP    3442020 A1     2/2019
JP    2000058744 A   2/2000
(Continued)

OTHER PUBLICATIONS

Japanese Office Action in the counterpart Japanese patent application No. 2020-057337 dated Jan. 9, 2024.

*Primary Examiner* — Michele Fan
(74) *Attorney, Agent, or Firm* — Rabin & Berdo, P.C.

(57) ABSTRACT

A semiconductor module includes a multilayer substrate having a main wiring layer formed therein, a main current flowing in the main wiring layer when the semiconductor device is turned on, a first and second semiconductor elements, each of which has a top electrode on a top surface thereof and a bottom electrode on a bottom surface thereof, and is disposed on a top surface of the main wiring layer to which the bottom electrode is conductively connected, a metal plate having an end portion, a bottom surface of the end portion being conductively connected to the top electrode of the first semiconductor element, and a control board including an insulating plate disposed on the top surface of the end portion and a control wiring layer disposed on a top surface of the insulating plate for controlling turning on and off of the first and second semiconductor elements.

7 Claims, 11 Drawing Sheets

(51) Int. Cl.
*H01L 23/50*      (2006.01)
*H01L 23/64*      (2006.01)
*H01L 25/07*      (2006.01)

(52) U.S. Cl.
CPC ............ *H01L 23/647* (2013.01); *H01L 24/32* (2013.01); *H01L 2224/32245* (2013.01)

(56) References Cited

FOREIGN PATENT DOCUMENTS

| | | | | |
|---|---|---|---|---|
| JP | 2009130186 | A | * | 6/2009 |
| JP | 2009302552 | A | | 12/2009 |
| JP | 2017199811 | A | * | 11/2017 |
| JP | 2018160699 | A | | 10/2018 |
| WO | 2017163612 | A1 | | 9/2017 |

* cited by examiner

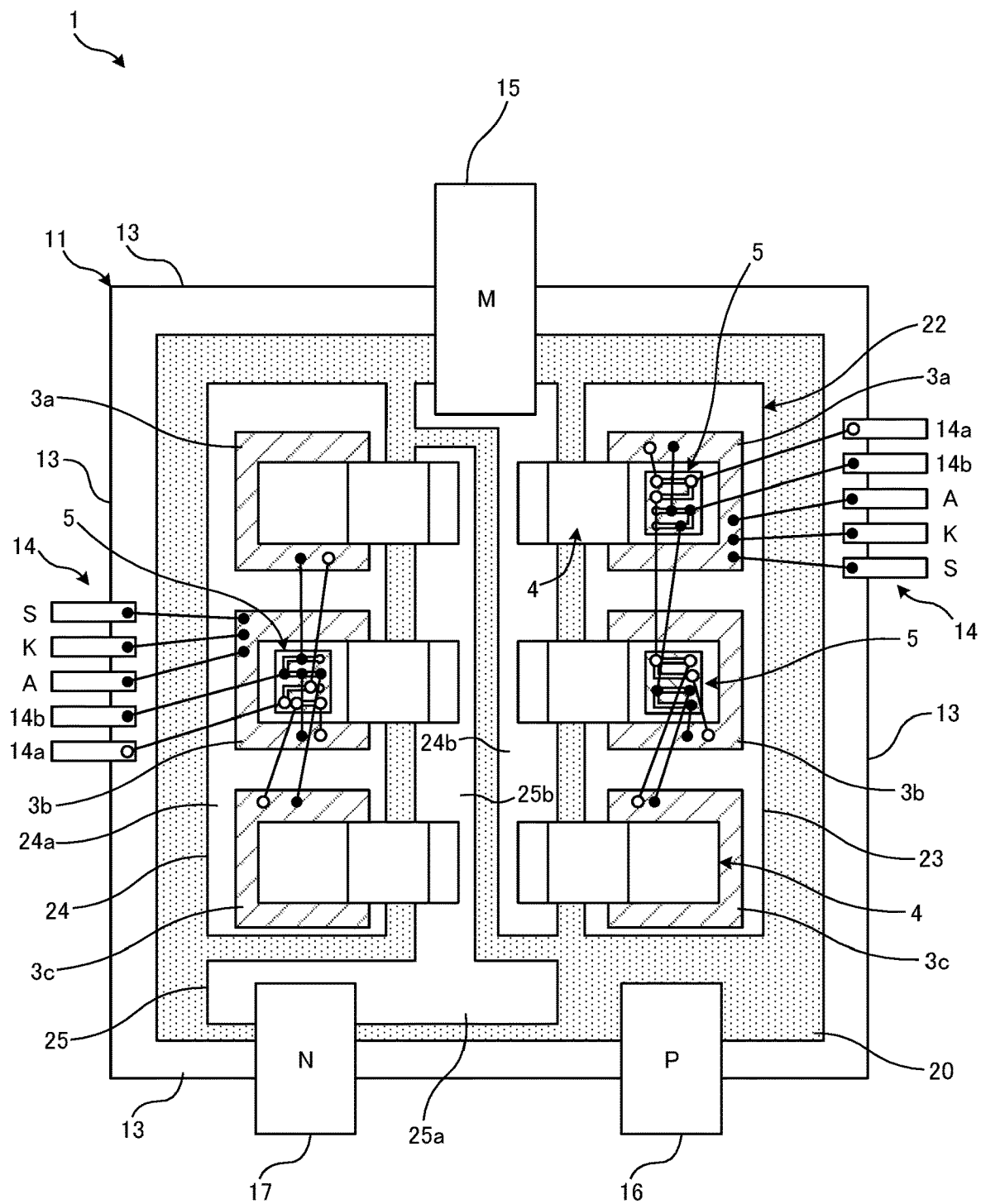
FIG. 11
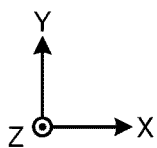

SEMICONDUCTOR MODULE

CROSS REFERENCE TO RELATED APPLICATIONS

This is a divisional application of U.S. application Ser. No. 17/187,588 filed on Feb. 26, 2021, which is based upon and claims the benefit of priority of the prior Japanese Patent Application No. 2020-057337, filed on Mar. 27, 2020, the entire contents of which are incorporated herein by reference.

BACKGROUND OF THE INVENTION

Field of the Invention

The present invention relates to a semiconductor module.

Description of the Related Art

Semiconductor devices have a substrate on which semiconductor elements such as an insulated-gate bipolar transistor (IGBT), a power metal-oxide-semiconductor field-effect transistor (power MOSFET), and a free-wheeling diode (FWD) are provided, and are used in apparatus such as inverters (see Patent Literatures 1 to 3, for example). Patent Literature 1 describes a semiconductor module provided with semiconductor chips connected in parallel and a top plate electrodes, along with the respective electrode patterns, which connect the semiconductor chips. Patent Literature 2 describes a module including semiconductor chips connected in parallel, in which signal wiring patterns are not disposed on an insulating substrate but instead aggregated in a relay substrate to reduce the mounting area. Patent Literature 3 describes disposing an insulating plate having a control signal conductor pattern on top of semiconductor chips connected in parallel. Patent Literature 4 describes forming a pattern on the same surface of a substrate on which a power semiconductor chip is mounted to draw out signal lines such as a gate signal and a source signal to desired external terminals.

CITATION LIST

Patent Literature

Patent Literature 1: Japanese Laid-open Patent Application No. 2009-302552
Patent Literature 2: International Publication No. WO 2017/163612
Patent Literature 3: Japanese Laid-open Patent Application No. 2000-058744
Patent Literature 4: Japanese Laid-open Patent Application No. 2018-160699

SUMMARY OF THE INVENTION

As described above, in a semiconductor module, a wiring pattern is typically formed on the same surface as a substrate on which semiconductor elements are mounted to draw out signal lines such as gate signals and source signals for driving the semiconductor elements to desired external terminals. Also, the same electrodes of these semiconductor elements are electrically connected by a metal plate.

However, the substrate on which the semiconductor elements are mounted is costly, and because heat is generated when large currents flow through the main wiring, heat dissipation measures are necessary. On the other hand, the currents that flow through the signal lines (control wiring) like the above are not large compared to the main wiring, and therefore heat dissipation measures are unnecessary. Consequently, providing the main wiring and the signal wiring on the same substrate is a factor that leads to a bulkier and more costly substrate overall, and furthermore hinders miniaturization of the entire module.

The present invention has been devised in light of such points, and one object thereof is to provide a semiconductor module that can be miniaturized with a relatively low-cost configuration.

A semiconductor module according to an aspect of the present invention includes a multilayer substrate having a main wiring layer formed therein, a first semiconductor element and a second semiconductor element each having a top electrode and a bottom electrode, and disposed on a top face of the main wiring layer with the bottom electrode conductively connected to the main wiring layer, a metal plate having an end, the end being conductively connected to the top electrode of the first semiconductor element, and a control board for control wiring mounted on the end, wherein the control board includes an insulating plate disposed on a top face of the end, and a wiring layer disposed on a top face of the insulating plate.

Advantageous Effects of Invention

According to the present invention, miniaturization can be achieved with a relatively low-cost configuration.

BRIEF DESCRIPTION OF THE DRAWING

FIG. 11 is a plan view of a semiconductor module according to a fifth modification.

DETAILED DESCRIPTION OF THE PREFERRED EMBODIMENT

Figure 1:
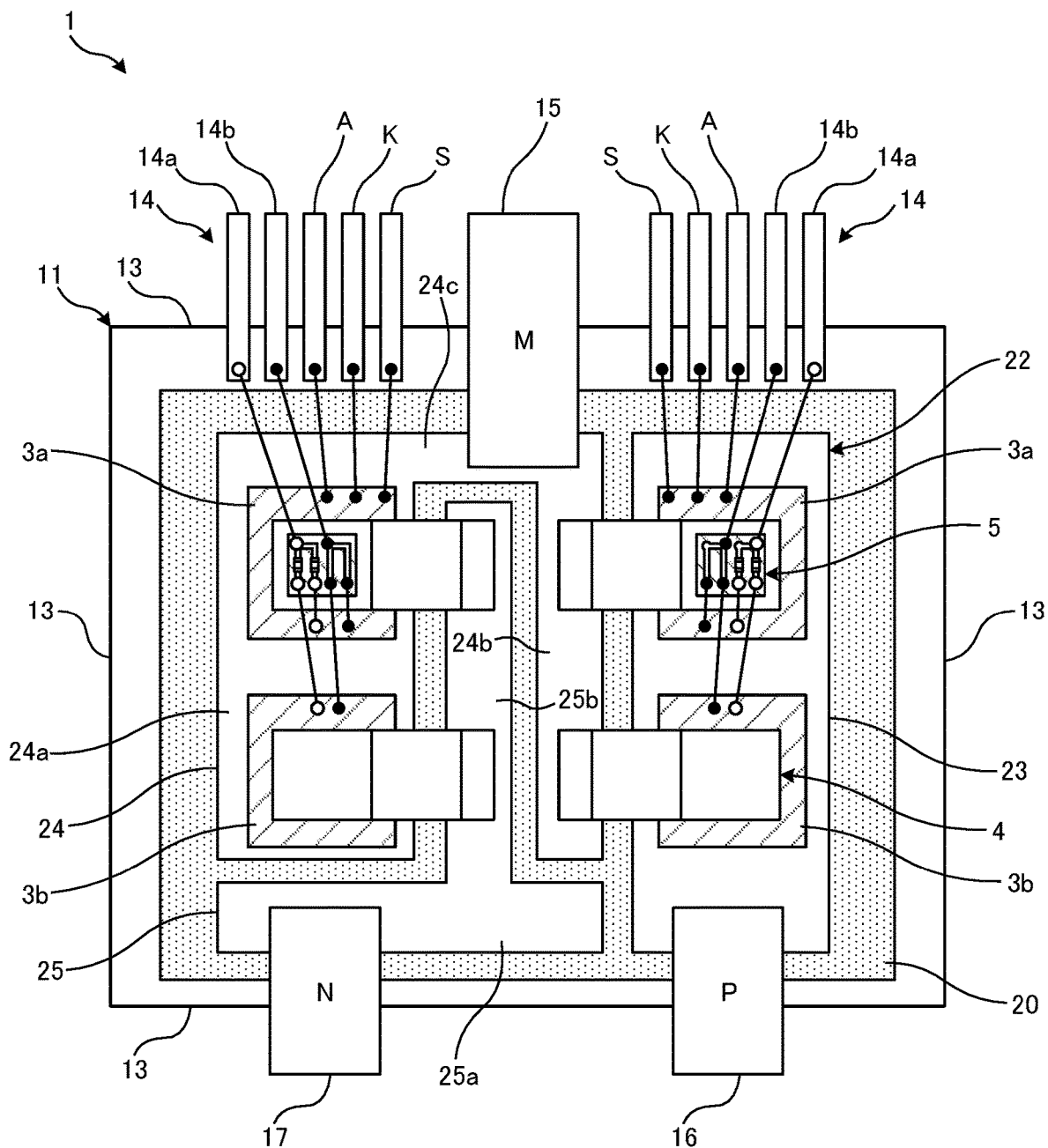
FIG. 1 is a plan view of a semiconductor module according to the present embodiment.
Figure 1:
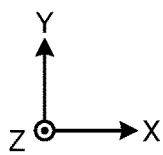
Figure 2:
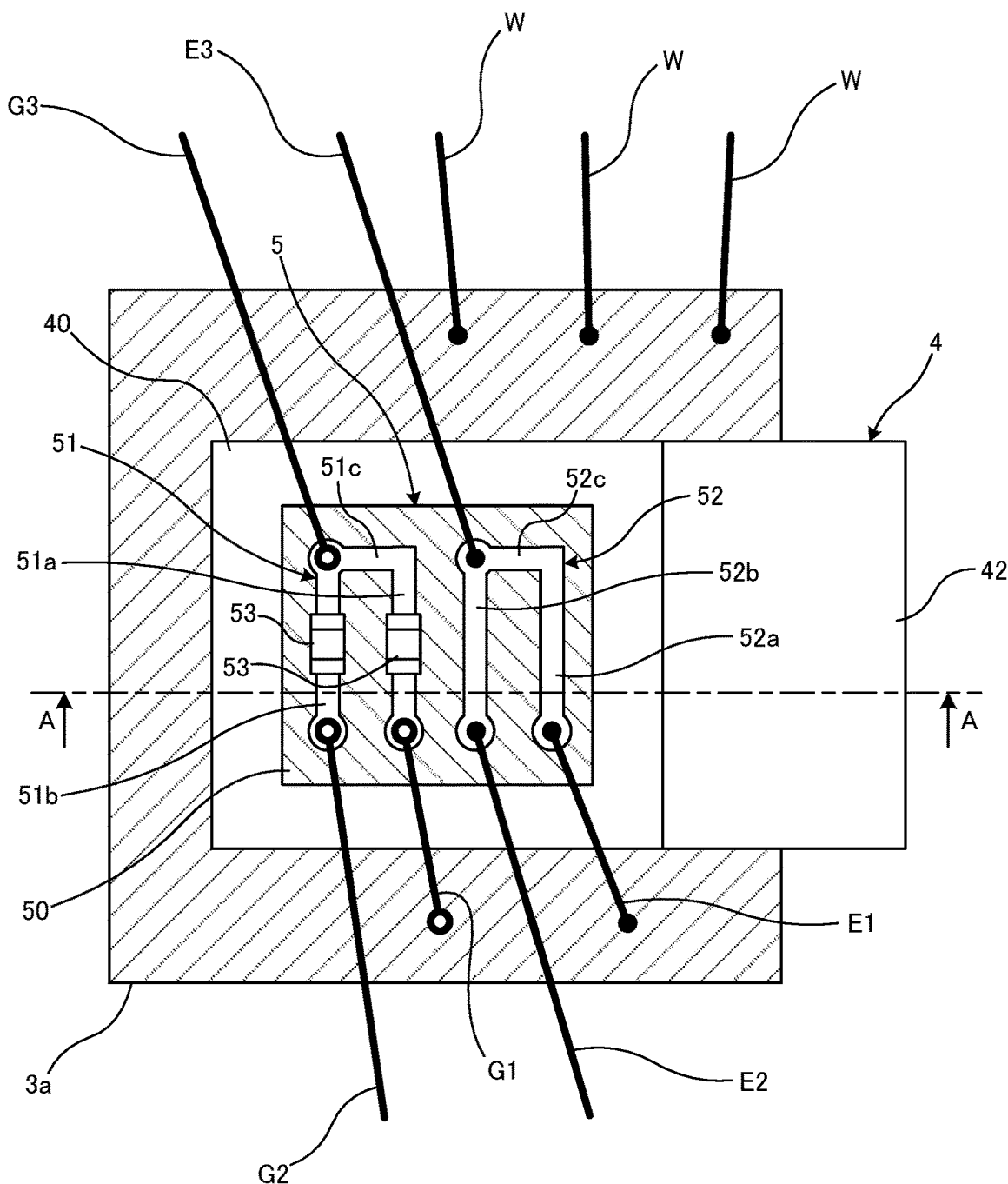
FIG. 2 is an enlarged view of the portion surrounding a predetermined semiconductor element illustrated in FIG. 1.
Figure 3:
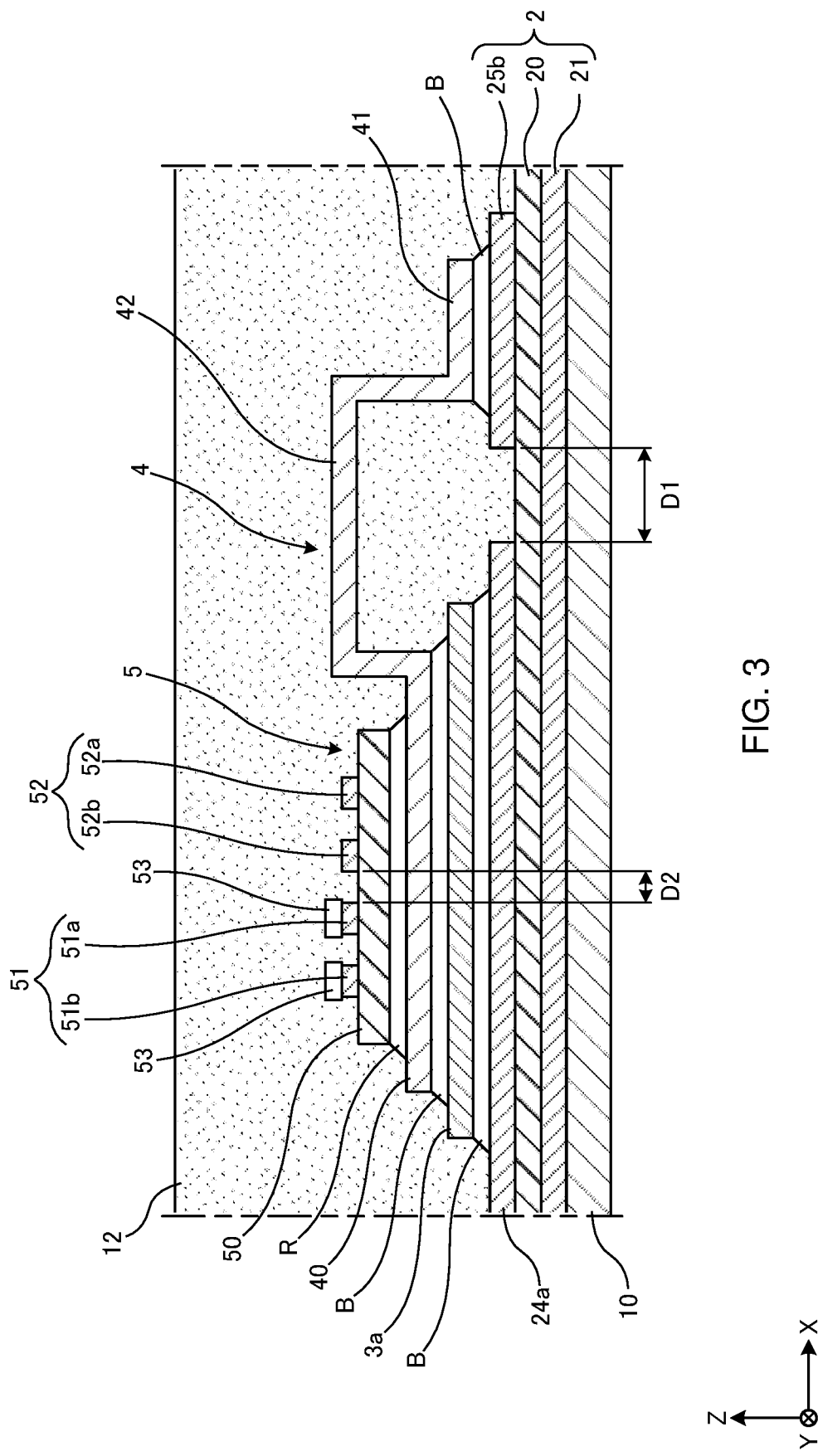
FIG. 3 is a cross-section illustrating the semiconductor module illustrated in FIG. 2 along the line A-A.
Figure 4:
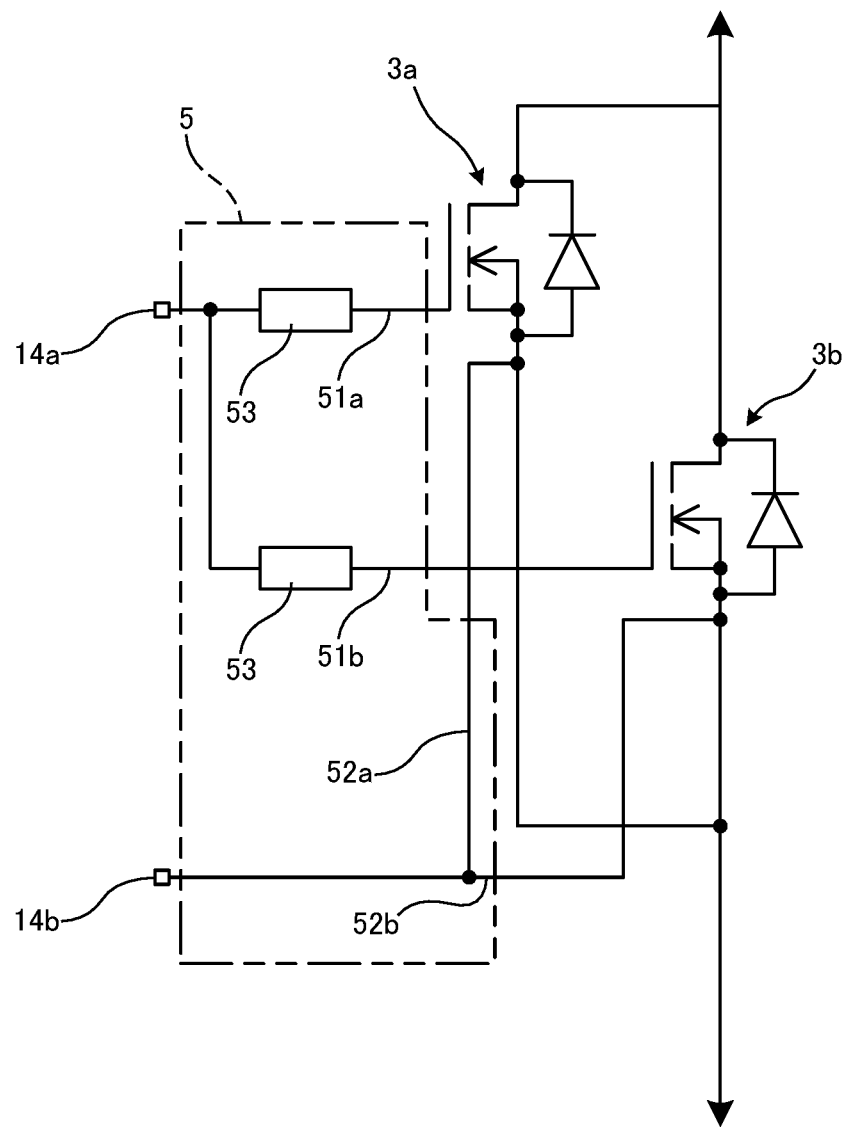
FIG. 4 is an equivalent circuit diagram of a semiconductor element and a control board according to the present embodiment.

Hereinafter, a semiconductor module capable of applying the present invention will be described. FIG. 1 is a plan view of a semiconductor module according to the present embodiment. FIG. 2 is an enlarged view of the portion surrounding a predetermined semiconductor element illustrated in FIG. 1. FIG. 3 is a cross-section illustrating the semiconductor module illustrated in FIG. 2 along the line A-A. FIG. 4 is an equivalent circuit diagram of a semiconductor element and a control board according to the present embodiment. Note that the semiconductor module illustrated below is merely one non-limiting example, and may be modified appropriately. Also, in the following diagrams, the ends of gate leads are denoted with a white circle (○), while the ends of auxiliary leads and other sense leads are denoted with a black circle (●). Note that in this specification, the term "emitter" may also be substituted with the term "source", and the term "collector" may also be substituted with the term "drain". These terms may be selected depending on the types of semiconductor elements applied to the module.

Also, in the following diagrams, the direction in which a plurality of semiconductor modules are arranged (or the direction in which an upper arm and a lower arm connected in series are arranged) is defined as the X direction, the direction in which a plurality of semiconductor elements connected in parallel are arranged on a predetermined arm is defined as the Y direction, and the height direction is defined as the Z direction. The illustrated X, Y, and Z axes are orthogonal to each other and constitute a right-handed coordinate system. Additionally, in some cases, the X direction may be referred to as the transverse direction, the Y direction as the longitudinal direction, and the Z direction as the vertical direction. These directions (transverse, longitudinal, and vertical directions) are terms used for convenience in the description, and depending on the installed attitude of the semiconductor module, the correspondence relationships between these directions and the XYZ directions may change. For example, the surface on the heat-dissipating side (cooler side) of the semiconductor module is referred to as the bottom face, while the opposite side is referred to as the top face. Also, in this specification, a plan view means the case of viewing the top face of the semiconductor module from the positive Z direction.

The semiconductor module according to the present embodiment is applied to a power conversion device such as a power module, for example, and is a power module that forms an inverter circuit. FIG. 1 will be referenced to describe a single semiconductor module 1. For example, in the case where the semiconductor module forms a three-phase inverter circuits, three semiconductor modules of FIG. 1 are arranged in the X direction in the order of U phase, V phase, W phase.

As illustrated in FIGS. 1 to 4, the semiconductor module 1 includes a base plate 10, a multilayer substrate 2 disposed on top of the base plate 10, a plurality of semiconductor elements disposed on top of the multilayer substrate 2, a case member 11 that houses the multilayer substrate 2 and the semiconductor elements, and an encapsulating resin 12 that fills the case member 11.

The base plate 10 is a rectangular plate having a top face and a bottom face. The base plate 10 functions as a heatsink. Additionally, the base plate 10 has a rectangular shape in a plan view that is long in the X direction. The base plate 10 is a metal plate containing copper, aluminum, or an alloy thereof, for example. The surface of the base plate 10 may also be plated.

The case member 11 having a rectangular frame shape in a plan view is disposed on the top face of the base plate 10. The case member 11 is formed with plastic for example, and is bonded to the top face of the base plate 10 by an adhesive (not illustrated). The case member 11 has a shape that follows the outline of the base plate 10, and a frame is formed by a pair of side walls 13 that face opposite each other in the X direction and a pair of side walls 13 that face opposite each other in the Y direction. The case member 11 demarcates a space that houses the multilayer substrate 2, the semiconductor elements, and the encapsulating resin 12.

The pairs of side walls 13 that face opposite each other in the X and Y directions are flat on top. Control terminals 14 for external connection are disposed on the side wall 13 positioned on the positive Y side from among the pair of side walls 13 that face opposite each other in the Y direction. The control terminals 14 have ends arranged in five columns in the X direction for each of upper and lower arms described later. The two outer ends in the X direction are a gate terminal 14a and an auxiliary terminal 14b, while the three inner ends in the X direction are sense terminals A, K, and S. The control terminals 14 on the upper arm side and the control terminals 14 on the lower arm side are each arranged in the side wall 13 positioned on the positive Y side. Although described in detail layer, the positive X side is the upper arm side, and the negative X side is the lower arm side.

These control terminals 14 are embedded in the side wall 13 by solid casting. The respective ends of the control terminals 14 are dispose so as to be exposed on the top face of the side wall 13. The control terminals 14 are formed by a process such as bending a plate-shaped body of a metal material such as a copper material, a copper alloy material, an aluminum alloy material, or an iron alloy material, for example. Although described in detail later, wiring members for control are connected to the respective ends of the control terminals 14.

Also, in the pair of side walls 13 that face opposite each other in the Y direction of the case member 11, an output terminal 15 (M terminal) that acts as a case terminal is provided on the positive Y side, while a positive electrode terminal 16 (P terminal) and a negative electrode terminal 17 (N terminal) are provided as case terminals on the negative Y side. The output terminal 15 is disposed between the control terminals 14 on the upper arm side and the control terminals 14 on the lower arm side. The positive electrode terminal 16 and the negative electrode terminal 17 are arranged in the X direction. The positive electrode terminal 16 is positioned on the positive X side, and the negative electrode terminal 17 is positioned on the negative X side. These case terminals form external connection terminals for the main current, and are formed by press working or the like using a metal material such as a copper material, a copper alloy material, an aluminum alloy material, or an iron alloy material, for example.

Also, on the inner side of the case member 11, the multilayer substrate 2 is disposed on the top face of the base plate 10. The multilayer substrate 2 is formed by stacking metal layers and insulating layers, and includes a direct copper bonding (DCB) substrate, an active metal brazing (AMB) substrate, or a metal base substrate, for example. Specifically, the multilayer substrate 2 includes an insulating plate 20, a heatsink 21 disposed on the bottom face of the insulating plate 20, and a plurality of circuit boards 22 disposed on the top face of the insulating plate 20. The multilayer substrate 2 is formed into a rectangular shape in a plan view, for example.

The insulating plate 20 has a predetermined thickness in the Z direction, and is formed into a tabular shape having a top face and a bottom face. The insulating plate 20 is formed by a ceramic material such as alumina ($Al_2O_3$), aluminum nitride (AlN), or silicon nitride ($Si_3N_4$), a resin material such as epoxy, or an insulating material such as an epoxy resin using a ceramic material as a filler, for example. Note that the insulating plate 20 may also be referred to as an insulating layer or an insulating film.

The heatsink 21 has a predetermined thickness in the Z direction, and is formed so as to cover the entire bottom face of the insulating plate 20. The heatsink 21 is formed by a metal plate with favorable thermal conductivity, such as copper or aluminum, for example.

On the top face (main surface) of the insulating plate 20, the plurality of circuit boards 22 are formed as independent islands that are electrically insulated from each other. The plurality of circuit boards 22 contain a metal layer of predetermined thickness formed by copper foil or the like. The plurality of circuit boards 22 forms a main wiring layer through which the main current flows. Specifically, the plurality of circuit boards 22 includes first to third conductive layers 23 to 25.

The first conductive layer 23 is disposed off-center on the positive X side of the insulating plate 20, and has a rectangular shape in a plan view that is long in the Y direction. The positive electrode terminal 16 is connected to the negative Y end of the first conductive layer 23. Although described in detail later, two semiconductor elements 3a and 3b forming the upper arm are disposed on the top face of the first conductive layer 23.

The second conductive layer 24 is disposed close to the negative X side than the first conductive layer 23, and is U-shaped in a plan view with the open end of the U on the negative Y side. Specifically, the second conductive layer 24 has a pair of elongated parts 24a and 24b that extend in a predetermined direction (Y direction) and face opposite each other in a direction (X direction) intersecting the predetermined direction, and a joining part 24c that joins one end of each of the pair of the elongated parts 24a and 24b to each other. The elongated part 24a is positioned on the negative X side while the elongated part 24b is positioned on the positive X side. Also, the elongated part 24a is wider in the X direction than the elongated part 24b. Although described in detail later, two semiconductor elements 3a and 3b forming the lower arm are disposed on the top face of the elongated part 24a. The joining part 24c joins the positive Y ends of the pair of elongated parts 24a and 24b to each other.

The third conductive layer 25 is disposed closer to the negative side than the first conductive layer 23 and also closer to the negative Y side than the second conductive layer 24, and is T-shaped in a plan view. Specifically, the third conductive layer 25 includes an elongated part 25a that extends in the X direction, and an elongated part 25b that extends in the positive Y direction from a position partway along the elongated part 25a. The elongated part 25a is disposed near the negative Y end of the insulating plate 20. The negative electrode terminal 17 is connected to the negative X end of the elongated part 25a. The elongated part 25b is disposed in between the pair of elongated parts 24a and 24b.

A plurality of semiconductor elements are disposed through a bonding material B such as solder (see FIG. 3) at predetermined locations on the top face of the circuit boards 22 (main wiring layer). With this arrangement, bottom electrodes of the semiconductor elements are conductively connected to the main wiring layer. The semiconductor elements are formed having a square shape in a plan view by a semiconductor substrate such as silicon (Si), silicon carbide (SiC), or gallium nitride (GaN), for example. In the present embodiment, the semiconductor elements are reverse-conducting IGBT (RC-IGBT) elements combining the functions of an IGBT element and a FWD element, or power MOSFET elements.

Note that the semiconductor elements are not limited to the above, and may also be a combination of a switching element such as an IGBT, a power MOSFET, or a bipolar junction transistor (BJT) and a diode such as a FWD. Also, an element such as a reverse-blocking IGBT (RB-IGBT) having a sufficient withstand voltage with respect to reverse bias may also be used as the semiconductor elements. Also, properties such as the shape, number, and placement of the semiconductor elements may be changed appropriately. Note that the semiconductor elements according to the present embodiment are vertical switching elements in which a functional element such as a transistor is formed on a semiconductor substrate.

In the present embodiment, four semiconductor elements are disposed for a single phase. Specifically, in the present embodiment, two semiconductor elements 3a and 3b (first semiconductor elements) forming the upper arm and another two semiconductor elements 3a and 3b (second semiconductor elements) forming the lower arm are provided. The upper arm is positioned on the positive X side, and the lower arm is positioned on the negative X side. In other words, the upper arm and the lower arm are arranged in the direction (X direction) in which the plurality of control terminals 14 are arranged.

Each semiconductor element has a top electrode and a bottom electrode. The top electrode may also be referred to as the emitter electrode, the source electrode, or the main electrode. The bottom electrode may also be referred to as the collector electrode, the drain electrode, or the main electrode. Also, in each semiconductor element, a gate electrode (not illustrated) that acts as a control electrode is disposed off-center near the perimeter of the top face. In other words, the gate electrode is disposed off-center near an edge of each semiconductor element. In the semiconductor elements 3a and 3b, an auxiliary electrode for gate driving connected to the top electrode may also be provided beside the gate electrode. The auxiliary electrode may be referred to as the driving source electrode in the case where the semiconductor element is a MOSFET, and may be referred to as the driving emitter electrode in the case of an IGBT. Although described in detail later, the two semiconductor elements 3a positioned on the positive Y side are sensing chips having a sensing function, and includes sense electrodes (not illustrated) for temperature/current sensing on the top face.

The two semiconductor elements 3a and 3b forming the upper arm are disposed on the top face of the first conductive layer 23 and are electrically connected in parallel. The semiconductor elements 3a and 3b are arranged in the Y direction (predetermined direction). The semiconductor element 3a is positioned on the positive Y side, and the other semiconductor element 3b is positioned on the negative Y side.

The two semiconductor elements 3a and 3b forming the lower arm are disposed on the top face of the second conductive layer 24 (elongated part 24a) and are electrically connected in parallel. The semiconductor elements 3a and 3b are arranged in the Y direction (predetermined direction). The semiconductor element 3a is positioned on the positive Y side, and the other semiconductor element 3b is positioned on the negative Y side.

In each arm, the semiconductor elements 3a and 3b are disposed such that the gate electrodes face inwardly toward each other in the Y direction. Also, the upper arm and the lower arm are disposed symmetrically about the center in the X direction of the multilayer substrate 2, and are connected in series.

Also, the top electrode of each semiconductor element and a predetermined circuit board 22 are electrically connected by a metal plate 4 that acts as a main current wiring member. The metal plate 4 is disposed in correspondence with each semiconductor element. Note that in the embodiment, each metal plate has the same configuration and therefore will be denoted by a common sign in the description.

The top electrodes of the semiconductor elements 3a and 3b in the upper arm are conductively connected to the second conductive layer 24 (elongated part 24b) through the metal plate 4. The top electrodes of the semiconductor elements 3a and 3b in the lower arm are conductively connected to the third conductive layer 25 (elongated part 25b) through the metal plate 4.

The metal plate 4 is formed by a bending process such as press working using a metal material such as a copper material, a copper alloy material, an aluminum alloy material, or an iron alloy material, for example. Specifically, as illustrated in FIG. 3, the metal plate 4 has a first bonding part 40 bonded to the top electrode of a predetermined semiconductor element, a second bonding part 41 bonded to a predetermined circuit board 22 (conductive layer), and a joining part 42 that joins the first bonding part 40 and the second bonding part 41. The first bonding part 40 forms one end of the metal plate 4, and the second bonding part 41 forms the other end of the metal plate 4. Note that the shape of the metal plate 4 illustrated in FIG. 3 is merely one example, and the shape may be changed appropriately. The metal plate 4 may also be referred to as a lead frame. Also, each metal plate 4 extends in the X direction in the plan view illustrated in FIG. 1. Through these connections, the main circuit for a single phase is formed.

Also, in the present embodiment, a control board 5 having a wiring layer for control wiring formed therein is mounted separately from the multilayer substrate 2 having the main wiring layer formed therein. The control board 5 is formed by stacking a metal layer and an insulating layer, and is a printed circuit board, for example. One control board 5 is provided for each arm, and is disposed on the top face of a predetermined metal plate 4 (first bonding part 40). The placement of the control board 5 will be described later.

As illustrated in FIGS. 2 to 4, the control board 5 includes an insulating plate 50 disposed on the top face of the first bonding part 40, and a gate wiring layer 51 and an auxiliary wiring layer 52 formed on the top face of the insulating plate 50. The insulating plate 50 has a rectangular shape in a plan view that is smaller than the first bonding part 40. The gate wiring layer 51 and the auxiliary wiring layer 52 contain a metal layer of predetermined thickness formed by copper foil or the like. The gate wiring layer 51 and the auxiliary wiring layer 52 form a wiring layer. The gate wiring layer 51 and the auxiliary wiring layer 52 extend in the Y direction, and are arranged in the X direction.

The gate wiring layer 51 is disposed off-center on the negative X side of the insulating plate 50, and is U-shaped in a plan view with the open end of the U on the negative Y side. Specifically, the gate wiring layer 51 has a pair of elongated parts (gate wiring parts) 51a and 51b that extend in a predetermined direction (Y direction) and face opposite each other in a direction (X direction) intersecting the predetermined direction, and a joining part 51c that joins one end of each of the pair of the elongated parts 51a and 51b to each other. The elongated part 51a is positioned on the positive X side while the elongated part 51b is positioned on the negative X side. The joining part 51c joins the positive Y ends of the pair of elongated parts 51a and 51b to each other.

In other words, the gate wiring layer 51 has a gate input end, and first and second gate output ends branching out from the gate input end. The gate input end is the end of the joining part 51c, the first gate output end is the negative Y end of the elongated part 51a, and the second gate output end is the negative Y end of the elongated part 51b. These output ends are provided at positions where the wiring members to each of the semiconductor elements do not intersect.

The auxiliary wiring layer 52 is disposed off-center on the positive X side of the insulating plate 50, and is U-shaped in a plan view with the open end of the U on the negative Y side. Specifically, the auxiliary wiring layer 52 has a pair of elongated parts (auxiliary wiring parts) 52a and 52b that extend in a predetermined direction (Y direction) and face opposite each other in a direction (X direction) intersecting the predetermined direction, and a joining part 52c that joins one end of each of the pair of the elongated parts 52a and 52b to each other. The elongated part 52a is positioned on the positive X side while the elongated part 52b is positioned on the negative X side. The joining part 52c joins the positive Y ends of the pair of elongated parts 52a and 52b to each other. In this way, the gate wiring layer 51 and the auxiliary wiring layer 52 are arranged in the X direction with each elongated part extending in the Y direction. Although details will be described later, the gap between the elongated parts forming the wiring layer is smaller than the gap between the circuit boards 22 (main wiring layer) of the multilayer substrate 2.

In other words, the auxiliary wiring layer 52 has an auxiliary input end, and first and second auxiliary output ends branching out from the auxiliary input end. The auxiliary input end is the end of the joining part 52c, the first auxiliary output end is the negative Y end of the elongated part 52a, and the second auxiliary output end is the negative Y end of the elongated part 52b. These output ends are provided at positions where the wiring members to each of the semiconductor elements do not intersect.

Also, chip resistors 53 are disposed partway along the gate wiring layer 51. Specifically, a chip resistor 53 is disposed partway along each of the elongated parts 51a and 51b. These chip resistors 53 are bonded to the top faces of the elongated parts 51a and 51b by a bonding material such as solder (not illustrated). Although details will be described later, the chip resistors 53 may also be disposed partway along the auxiliary wiring layer 52. Note that in the embodiment, the chip resistors 53 are disposed at middle positions in the longitudinal direction of the elongated parts 51a and 51b, but the chip resistors 53 may also be disposed off-center at one or another end of the elongated parts 51a and 51b.

The control board 5 configured in this way is disposed through a bonding material R on the top face of the metal plate 4 in each arm. The bonding material R may contain an adhesive, solder, or a sintered material, for example. The control boards 5 are disposed on the top faces of the metal plates 4 (first bonding part 40) provided in correspondence with the semiconductor elements 3a positioned near the control terminals 14. In other words, the control boards 5 are disposed above (directly above) the sensing chips (semiconductor elements 3a) that have a sensing function. In other words, the control boards 5 are not disposed above the non-sensing chips (semiconductor elements 3b) that do not have a sensing function. Consequently, the number of control boards 5 is less than the number of semiconductor elements.

The control boards 5 and the semiconductor elements as well as the control boards 5 and the control terminals 14 described above are electrically connected by predetermined wiring members. For example, the gate wiring layer 51 and the semiconductor element are connected by a gate lead, while the auxiliary wiring layer 52 and the semiconductor element are connected by an auxiliary lead.

More specifically, the negative Y end of the elongated part 51a is electrically connected to the gate electrode of one semiconductor element 3a through a gate lead G1. The negative Y end of the elongated part 51b is electrically connected to the gate electrode of the other semiconductor element 3b through a gate lead G2. The negative Y end of the elongated part 52a is connected to the top electrode of one semiconductor element 3a through an auxiliary lead E1. The negative Y end of the elongated part 52b is connected to the top electrode of the other semiconductor element 3b through an auxiliary lead E2. In each of the semiconductor elements 3a and 3b, an auxiliary electrode connected to the top electrode may also be provided beside the gate electrode. The auxiliary leads E1 and E2 may also be connected to the auxiliary electrodes of the semiconductor elements 3a and 3b, respectively.

Also, the positive Y end of the gate wiring layer 51 (elongated part 51b) (that is, the negative X end of the joining part 51c) is connected to the gate terminal 14a through a gate lead G3. The positive Y end of the auxiliary wiring layer 52 (elongated part 52b) (that is, the negative X end of the joining part 52c) is connected to the auxiliary terminal 14b through an auxiliary lead E3. Also, the sense electrodes of semiconductor element 3a are each connected to the sense terminals A, K, and S through respective sense leads W.

Conductor wires (bonding wires) are used as these wiring members. Gold, copper, aluminum, gold alloy, copper alloy, and aluminum alloy can be used either singly or in combination with each other as the material of the conductor wires. Additionally, it is also possible to use member other than conductor wires as the wiring members. For example, ribbons can be used as the wiring members.

Incidentally, in a semiconductor module, a wiring pattern (wiring layer) is typically formed on the same surface as a multilayer substrate having the main wiring layer for the main current formed therein to draw out signal lines (control wiring for driving) such as gate signals and auxiliary leads for driving the semiconductor elements to desired external terminals (control terminals). Also, the same electrodes of these semiconductor elements are electrically connected by a metal plate.

However, the multilayer substrate having the main wiring layer formed therein is costly, and because heat is generated when large currents flow through the main wiring layer, heat dissipation measures are necessary. On the other hand, the currents that flow through the signal lines (control wiring) like the above are not large compared to the main wiring, and therefore heat dissipation measures are unnecessary. Also, in such a multilayer substrate, the wiring layers (metal layers) are formed using relatively thick copper foils to accommodate large currents and increase heat dissipation. In this case, the processing tolerance (etching tolerance) of the copper foils increases, which makes it difficult to reduce the gap between the copper foils. In other words, the gap between the copper foils must be secured to a certain degree.

Securing a large gap between the copper foils in this way makes it difficult to dispose elements such as chip resistors between the copper foils. Because of the above, providing the main wiring layer and the wiring layer on the same substrate is a factor that leads to a bulkier and more costly substrate overall, and furthermore hinders miniaturization of the entire module. Also, the signal lines described above are lengthened and thereby become susceptible to noise associated with switching, which may lead to malfunctions.

Accordingly, the inventors focused on the layout of the main wiring layer and the wiring layer on the multilayer substrate as well as the space on the top face of the metal plates, and thereby conceived of the present invention. Specifically, in the present embodiment, the control boards 5 having a wiring layer formed therein are disposed on the metal plates 4 separately from the multilayer substrate 2 having the main wiring layer formed therein, as illustrated in FIG. 1. The control boards 5 have a wiring layer disposed on the top face of the insulating plate 50.

More specifically, the wiring layer includes the gate wiring layer 51 connected to the gate electrodes of the semiconductor elements 3a and 3b through the gate leads G1 and G2, respectively, and the auxiliary wiring layer 52 connected to the top electrodes of the semiconductor elements 3a and 3b through the auxiliary leads E1 and E1, respectively.

According to this configuration, by providing the control boards 5 for the control wiring separately from the main wiring layer, the configuration of the multilayer substrate 2 is simplified. As a result, it is possible to make the multilayer substrate 2 smaller compared to a configuration in which the control wiring is provided on the same insulating plate 20. Also, by effectively utilizing the empty space on the metal plates 4, it is possible to dispose the control boards 5 without increasing the size of the module overall. Also, by forming the control boards 5 for the control wiring using low-cost boards such as printed circuit boards, it is possible to manufacture the module at lower cost overall while also simplifying the configuration of the multilayer substrate 2.

Figure 5:
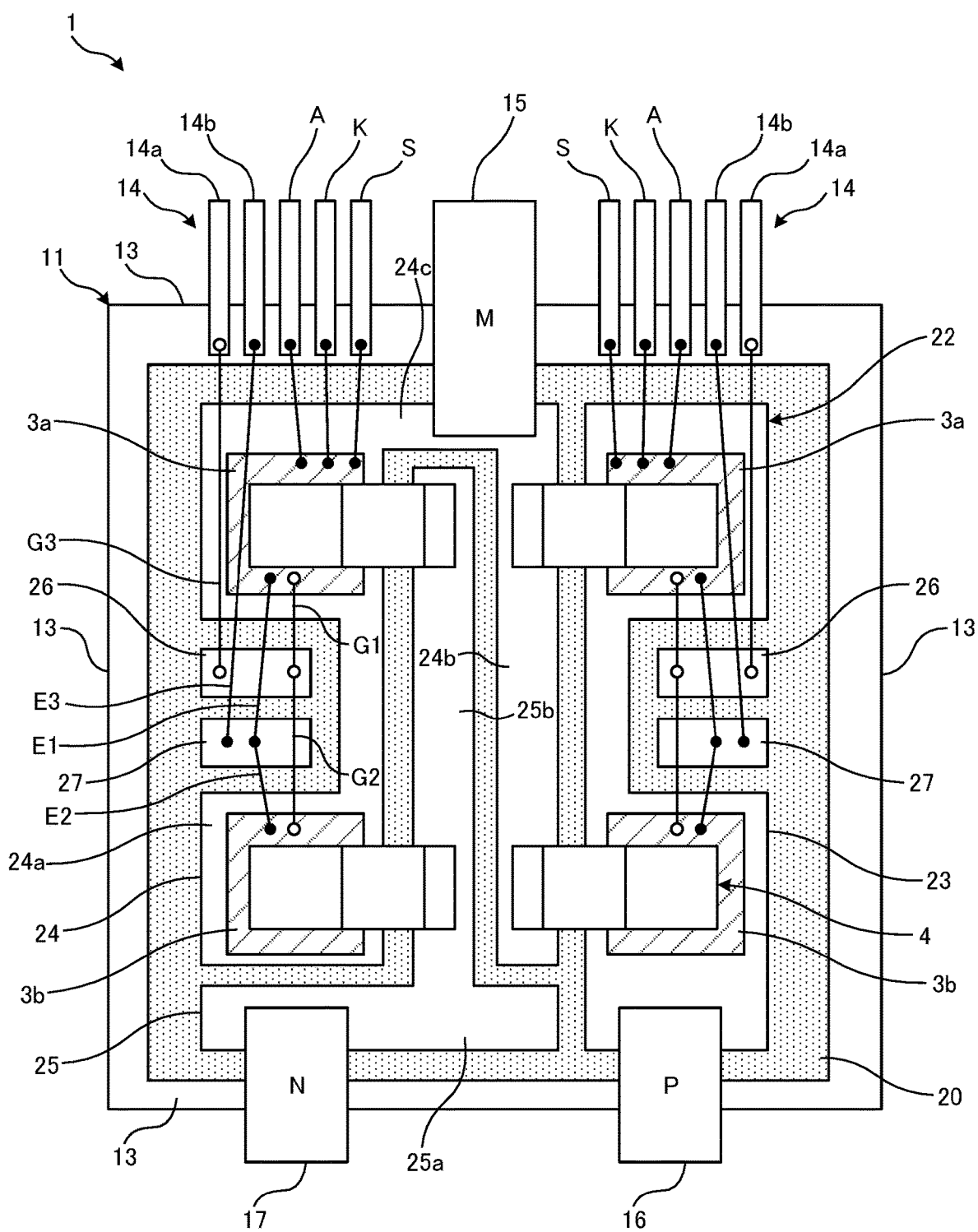
FIG. 5 is a plan view of a semiconductor module according to a comparative example.

Here, a comparative example will be described. FIG. 5 is a plan view of a semiconductor module according to the comparative example. FIG. 5 differs from the above embodiment in that the wiring layer is formed on top of the multilayer substrate 2. Consequently, the differences will be described mainly, and portions of the configuration that have already been described will be denoted with the same signs and omitted from further description where appropriate.

As illustrated in FIG. 5, in the comparative example, a central portion in the Y direction of the first conductive layer 23 is cut out, and a gate wiring layer 26 and an auxiliary wiring layer 27 are disposed on the insulating plate 20 as wiring layers in the cut-out portion. Similarly, a central portion in the Y direction of the second conductive layer 24 (elongated part 24a) is cut out, and a gate wiring layer 26 and an auxiliary wiring layer 27 are disposed on the insulating plate 20 as wiring layers in the cut-out portion. In this way, in the comparative example, the entire module is enlarged in the Y direction by an amount corresponding to the gate wiring layer 26 and the auxiliary wiring layer 27. In contrast, in the embodiment, the gate wiring layer 51 and the auxiliary wiring layer 52 are formed as the separate control boards 5 as described above, thereby making it possible to miniaturize the entire module compared to the comparative example.

Also, by disposing the control boards 5 directly above the semiconductor elements 3a, or more specifically on the top face of the first bonding part 40, it is possible to restrain an increase in the height dimension of the module while also effectively utilizing the empty space on top of the first bonding part 40.

Also, the control boards 5 are disposed on the top faces of the metal plates 4 provided in correspondence with the semiconductor elements 3a positioned near the control terminals 14. More specifically, the control boards 5 are disposed above the semiconductor elements 3a that have a sensing function. According to this configuration, because the control boards 5 are disposed close to the control terminals 14, the wiring lengths of the various wiring members described above are shortened, and the ease of wiring (wire bonding) is improved.

Additionally, because the gate wiring layer 51 and the auxiliary wiring layer 52 extend in the Y direction, it is easy to form the wiring with the control terminals 14 on one side (the positive side) in the Y direction and form the wiring with the other semiconductor elements 3b on the other side (the negative side) in the Y direction.

Also, in the present embodiment, the control boards 5 on the metal plates 4 are smaller than the first bonding part 40 in a plan view. According to this configuration, because the control boards 5 can be disposed inside the surface area of the first bonding part 40, the entire module is not enlarged.

Also, in the control boards 5, the gap D2 between the wiring layers is less than the gap D1 between the main wiring layers on the multilayer substrate 2. According to this configuration, the control boards 5 are reduced in size, thereby making it possible to dispose the control boards 5 inside the limited space on the metal plates 4.

As described above, according to the present embodiment, by disposing the control boards 5 having the wiring layer formed therein on the metal plates 4, separately from the multilayer substrate 2 having the main wiring layer formed therein, miniaturization can be achieved with a relatively low-cost configuration.

Also, in the above embodiment, the number and placement of the semiconductor elements are not limited to the above configuration and may be changed appropriately.

Also, in the above embodiment, the number and layout of circuit boards are not limited to the above configuration and may be changed appropriately.

Also, the above embodiment takes a configuration in which the multilayer substrate 2 and the semiconductor elements are formed in a rectangular or square shape in a plan view, but the embodiment is not limited to this configuration. The multilayer substrate 2 and the semiconductor elements may also be formed in a polygonal shape other than the above.

Also, the above embodiment describes a case where the upper arm is positioned on the positive X side and the lower arm is positioned on the negative X side, but the embodiment is not limited to this configuration. The positional relationship between the upper and lower arms may also be the reverse of the above.

Also, in the above embodiment, the positional relationship between the positive electrode terminal 16 and the negative electrode terminal 17 may be the reverse of the above.

Also, the above embodiment takes a configuration in which one end of the auxiliary leads is directly connected to the top electrodes, but the embodiment is not limited to this configuration. One end of the auxiliary leads may also be provided on the semiconductor elements and may be connected to the auxiliary electrodes connected to the top electrodes. One end of the auxiliary leads may also be connected to the top electrodes (the source electrodes of MOSFETs or the emitter electrodes of IGBTs) through the metal plates (first bonding part 40).

Figure 6:
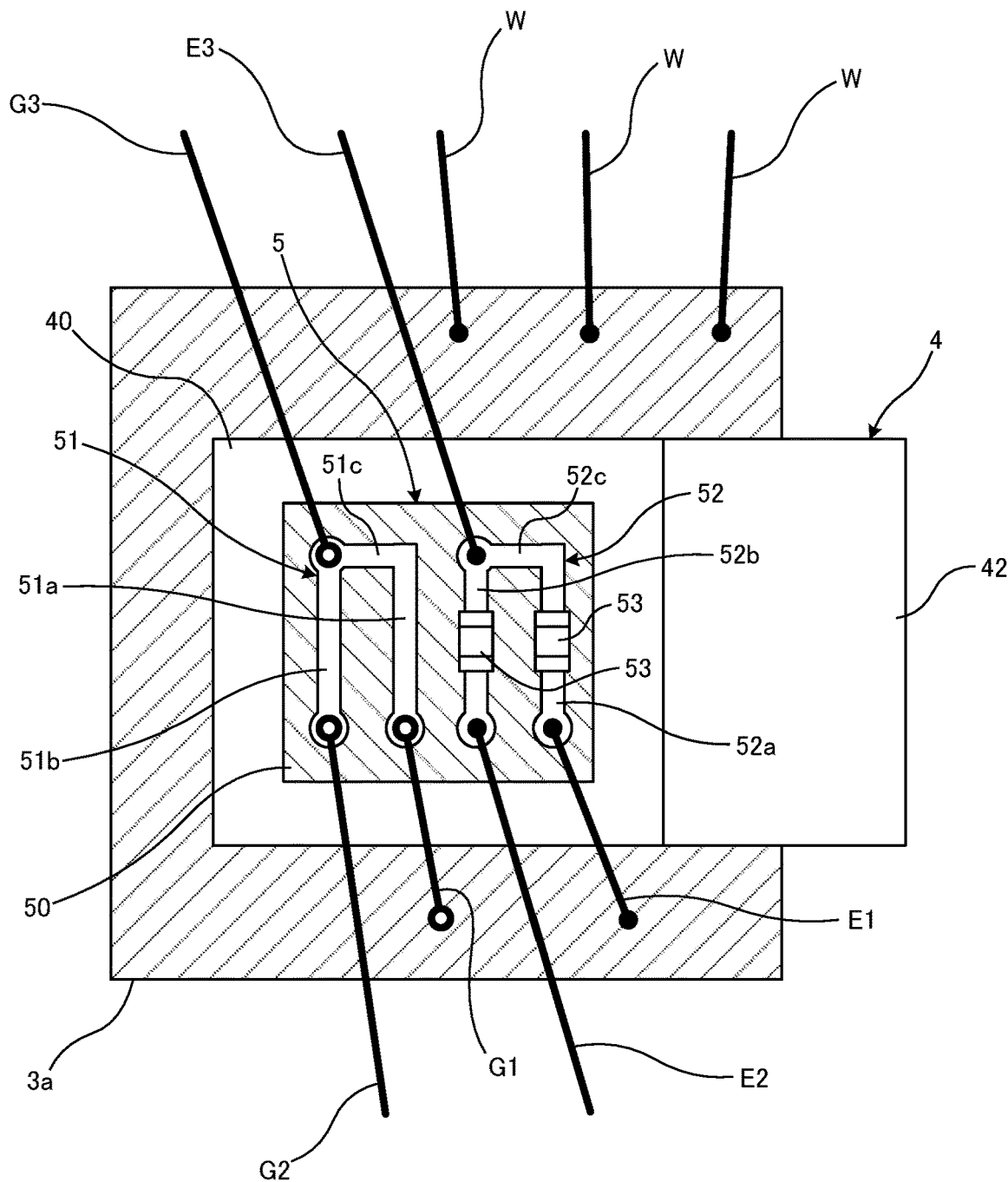
FIG. 6 is a plan view of the area surrounding a control board according to a first modification.
Figure 7:
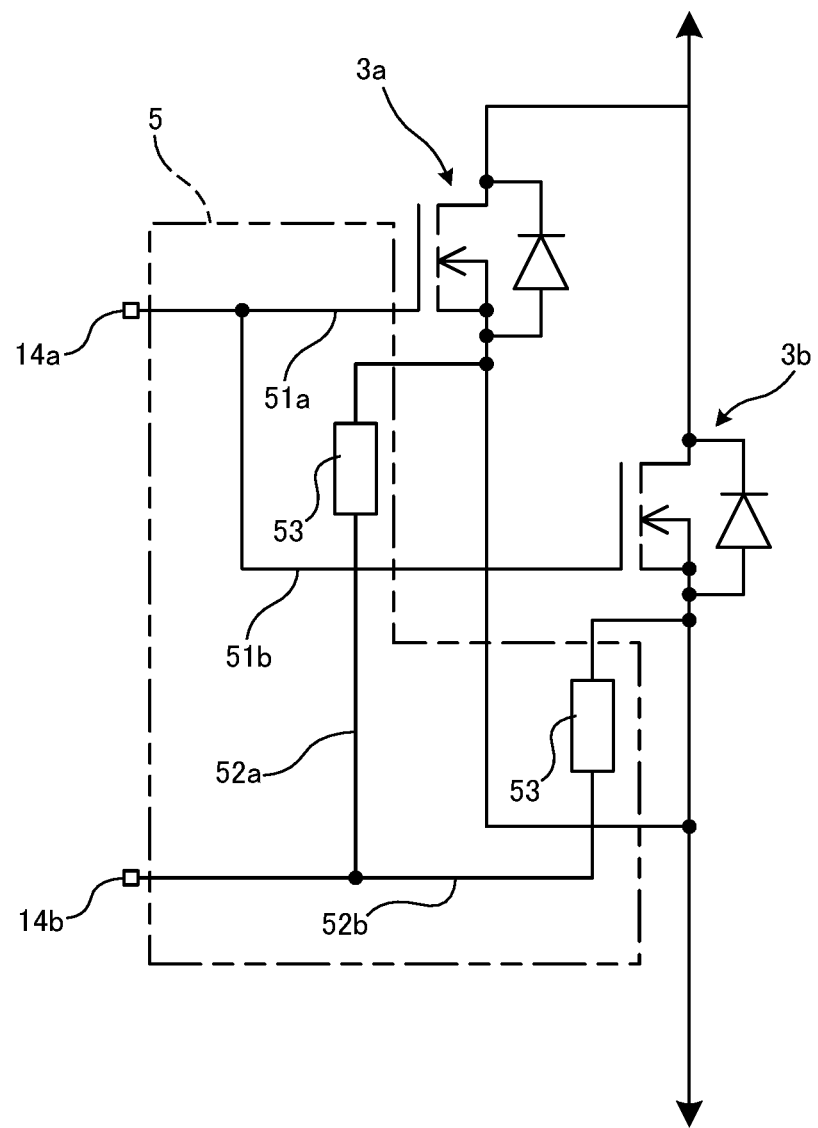
FIG. 7 is an equivalent circuit diagram of a semiconductor element and a control board according to the first modification.

Also, the above embodiment describes a case where the chip resistors 53 are disposed partway along the gate wiring layer 51. This configuration makes it possible to suppress gate oscillation. However, the embodiment is not limited to the above configuration, and may also take a configuration as illustrated in FIGS. 6 and 7. FIG. 6 is a plan view of the area surrounding a control board according to a first modification. FIG. 7 is an equivalent circuit diagram of a semiconductor element and a control board according to the first modification.

As illustrated in FIGS. 6 and 7, the chip resistors 53 are disposed partway along the auxiliary wiring layer 52. Specifically, a chip resistor 53 is disposed partway along each of the elongated parts 52a and 52b. These chip resistors 53 are bonded to the top faces of the elongated parts 52a and 52b by a bonding material such as solder (not illustrated). This configuration makes it possible to measure resistance values more easily in a manufacturing step.

Figure 8:
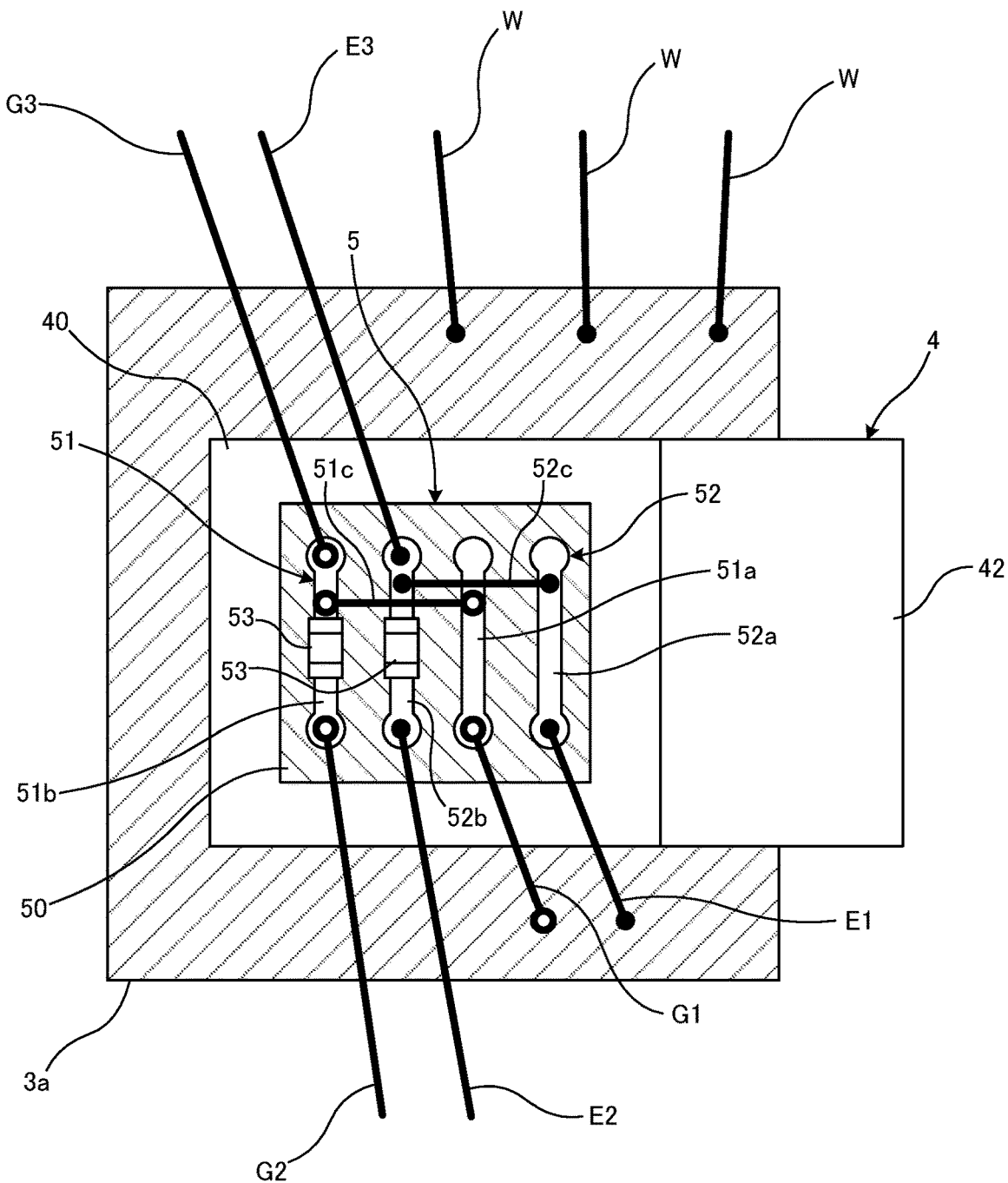
FIG. 8 is a plan view of the area surrounding a control board according to a second modification.
Figure 8:
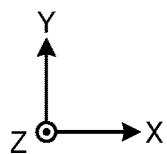
Figure 9:
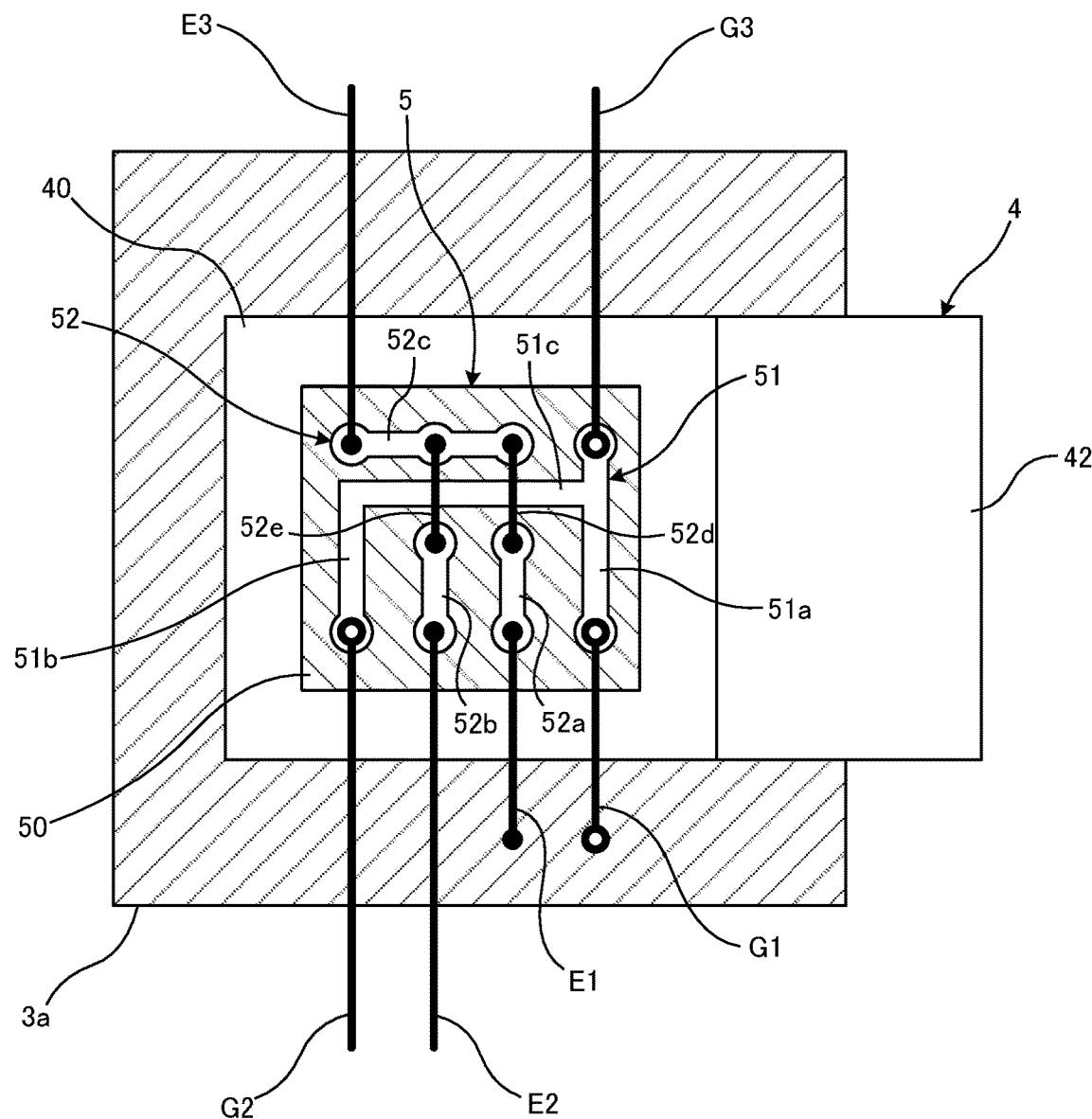
FIG. 9 is a plan view of the area surrounding a control board according to a third modification.

Furthermore, the control boards 5 are not limited to the configuration described above and may be changed appropriately. For example, configurations like in FIGS. 8 and 9 are also possible. FIG. 8 is a plan view of the area surrounding a control board according to a second modification. In FIG. 8, the gate wiring layer 51 and the auxiliary wiring layer 52 are arranged alternately for each semiconductor element. Specifically, the elongated parts 51a and 51b forming the gate wiring layer 51 and the elongated parts 52a and 52b forming the auxiliary wiring layer 52 are arranged alternately. In order from the positive X side, the elongated part 52a, the elongated part 51a, the elongated part 52b, and the elongated part 52a are arranged.

The positive Y ends of the elongated parts 51a and 51b are connected to each other by the joining part 51c, and the positive Y ends of the elongated parts 52a and 52b are connected to each other by the joining part 52c. The joining parts 51c and 52c are preferably configured by conductor wires or metal plates. According to this configuration, it is possible to arrange the wiring such that the gate lead G1 and the auxiliary lead E1, the gate lead G2 and the auxiliary lead E2, and the gate lead G3 and the auxiliary lead E3 are respectively adjacent and parallel to each other. This arrangement makes it possible to simplify the routing of the wiring. Also, by disposing a corresponding gate lead and auxiliary lead in parallel next to each other, it is possible to reduce the inductance between the gate and source (emitter) by the mutual inductance effect. Also, in any of the configurations illustrated in FIGS. 2, 6, and 8, each gate lead and auxiliary lead can be set to the same length, thereby making it possible to minimize inconsistencies in the inductance between the gate and source (emitter).

FIG. 9 is a plan view of the area surrounding a control board according to a third modification. In FIG. 9, the pair of the elongated parts 52a and 52b forming the auxiliary wiring layer 52 is disposed between the pair of elongated parts 51a and 51b forming the gate wiring layer 51. The joining part 52c is disposed on the opposite side in the Y direction from the pair of elongated parts 52a and 52b, with the joining part 51c in between. The elongated part 52a is connected to the joining part 52c through a wiring member 52d, and the elongated part 52b is connected to the joining part 52c through a wiring member 52e. Such a configuration is also possible. According to such an arrangement, the gate leads G1 and G2 do not intersect the auxiliary leads E1 and E2, even in the case where the two semiconductor elements 3a and 3b whose gate electrodes and auxiliary electrodes are disposed in the same order are arranged facing each other. Note that in the case of a layout in which the gate leads and auxiliary leads overlap in the same plane like in FIGS. 8 and 9, the control boards may also be configured as multilayer boards with a multilevel wiring layer. This arrangement makes it possible to shorten the wire leads as much as possible.

Figure 10:
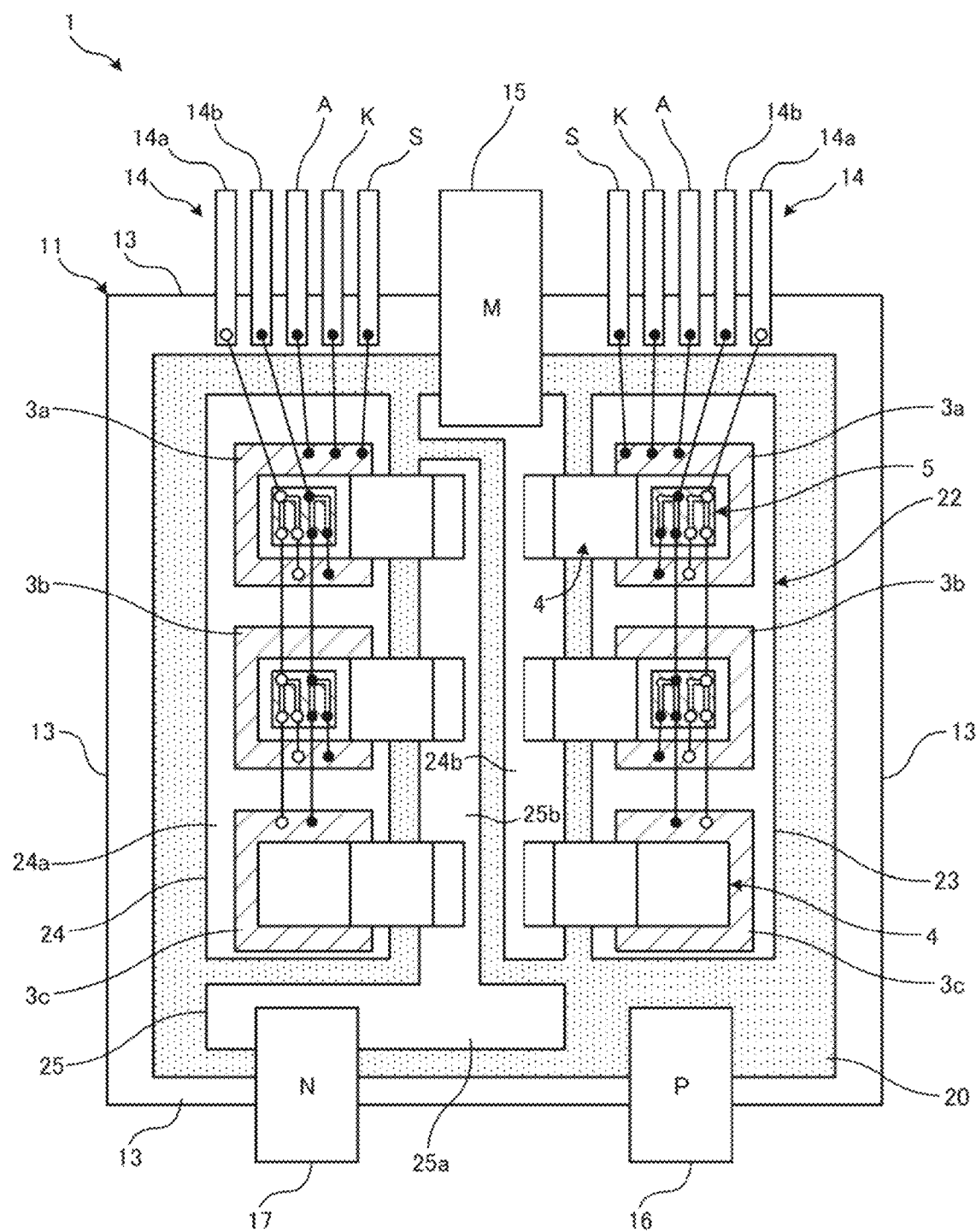
FIG. 10 is a plan view of a semiconductor module according to a fourth modification.

Also, the above embodiment describes a case where two semiconductor elements 3a and 3b are disposed in parallel in each arm, but the embodiment is not limited to this configuration. For example, configurations like in FIGS. 10 and 11 are also possible. FIG. 10 is a plan view of a semiconductor module according to a fourth modification. FIG. 11 is a plan view of a semiconductor module according to a fifth modification. FIGS. 10 and 11 are different from the above embodiment in that three semiconductor elements 3a, 3b, and 3c are arranged in the Y direction for each arm, and the second conductive layer 24 is divided into the elongated parts 24a and 24b.

As illustrated in FIG. 10, the control boards 5 are disposed above the semiconductor elements 3a and 3b positioned near the control terminals 14. In FIG. 10, the semiconductor elements 3a in both the upper and lower arms are sensing chips. As illustrated in FIG. 11, in the upper arm, the control boards 5 are disposed above the semiconductor elements 3a and 3b. In FIG. 11, the semiconductor element 3a in the upper arm and the semiconductor element 3b in the lower arm are sensing chips. Note that in the upper arm, the control terminals 14 are arranged in the Y direction near the positive X side of the semiconductor element 3a. Accordingly, the control board 5 is disposed such that the wiring layer is rotated 90 degrees to extend in the X direction. In the lower arm, the control terminals 14 are arranged in the Y direction near the negative X side of the semiconductor element 3b. Accordingly, the control board 5 is disposed such that the wiring layer is rotated 90 degrees to extend in the X direction. Also, in the control board 5 above the semiconductor element 3b in the upper arm, the wiring layer is disposed so as to be a mirror image of the other control board 5. Such a configuration is also possible.

In addition, the present embodiment and modifications have been described, but the above embodiment and the modifications may also be combined in full or in part and treated as another embodiment.

Also, the present embodiment is not limited to the above embodiment or modifications, and various modifications, substitutions, and alterations are possible without departing from the scope of the technical idea. Furthermore, if the technical idea can be achieved according to another method through the advancement of the technology or another derivative technology, the technical idea may be implemented using the method. Consequently, the claims cover all embodiments which may be included in the scope of the technical idea.

Features of the above embodiment are summarized below.

A semiconductor module according to the above embodiment comprises: a multilayer substrate having a main wiring layer formed therein; a first semiconductor element and a second semiconductor element each having a top electrode and a bottom electrode, and disposed on a top face of the main wiring layer with the bottom electrode conductively connected to the main wiring layer; a metal plate having an end, the end being conductively connected to the top electrode of the first semiconductor element; and a control board for control wiring mounted on the end, wherein the control board includes an insulating plate disposed on a top face of the end, and a wiring layer disposed on a top face of the insulating plate.

Also, in the above semiconductor module, the wiring layer includes a gate wiring layer connected to a gate electrode of each of the first semiconductor element and the second semiconductor element through a gate wiring member, and an auxiliary wiring layer connected to the top electrode of each of the first semiconductor element and the second semiconductor element through an auxiliary wiring member.

Also, in the above semiconductor module, the first semiconductor element and the second semiconductor element are connected in parallel to form arms arranged in a predetermined direction, a plurality of metal plates are respectively disposed in correspondence with the first semiconductor element and the second semiconductor element, a control terminal for external connection is further provided adjacent to the first semiconductor element, and the control board is disposed on the top face of the end provided in correspondence with the first semiconductor element.

Also, in the above semiconductor module, the control terminal is disposed off-center on one side of the predetermined direction, and the control board is disposed on the top face of the end provided in correspondence with the first semiconductor element positioned near the control terminal.

Also, in the above semiconductor module, the control board is disposed directly above the first semiconductor element.

Also, in the above semiconductor module, the gate wiring layer and the auxiliary wiring layer extend in a predetermined direction.

Also, in the above semiconductor module, a chip resistor is disposed partway along the gate wiring layer.

Also, in the above semiconductor module, a chip resistor is disposed partway along the auxiliary wiring layer.

Also, in the above semiconductor module, the control board is smaller than the end in a plan view.

Also, in the above semiconductor module, a plurality of control boards are provided, and the number of the control boards is less than the number of the first and second semiconductor elements.

Also, in the above semiconductor module, the control board is disposed above the first semiconductor element having a sensing function.

Also, in the above semiconductor module, the multilayer substrate has a plurality of main wiring layers, and a gap between the wiring layers is less than a gap between the plurality of main wiring layers.

Also, in the above semiconductor module, the gate wiring layer and the auxiliary wiring layer are arranged alternately for each of the first and second semiconductor elements.

Also, in the above semiconductor module, the gate wiring layer has a gate input end, and first and second gate output ends branching out from the gate input end, the auxiliary wiring layer has an auxiliary input end, and first and second auxiliary output ends branching out from the auxiliary input end, the first gate output end is connected to the gate electrode of the first semiconductor element, the second gate output end is connected to the gate electrode of the second semiconductor element, the first auxiliary output end is connected to the top electrode of the first semiconductor element, and the second auxiliary output end is connected to the top electrode of the second semiconductor element.

Also, in the above semiconductor module, the gate electrode is disposed off-center near a perimeter of each semiconductor element, the first semiconductor element and the second semiconductor element are disposed such that the respective gate electrodes face opposite each other, and the first gate output end, the first auxiliary output end, the second gate output end, and the second auxiliary output end are provided at positions where the wiring members from each of the output ends to each of the semiconductor elements do not intersect.

Also, in the above semiconductor module, the control board contains a multilevel wiring layer.

Also, in the above semiconductor module, the first semiconductor element and the second semiconductor element include a metal-oxide-semiconductor field-effect transistor (MOSFET) element or an insulated-gate bipolar transistor (IGBT) element.

INDUSTRIAL APPLICABILITY

As described above, the present invention has an effect of enabling miniaturization with a relatively low-cost configuration to be achieved, and is particularly useful in a semiconductor module.

REFERENCE SIGNS LIST 1 semiconductor module
2 multilayer substrate
3a first semiconductor element
3b second semiconductor element
4 metal plate
5 control board
10 base plate
11 case member
12 encapsulating resin
13 side wall
14 control terminal
14a gate terminal
14b auxiliary terminal
15 output terminal
16 positive electrode terminal
17 negative electrode terminal
20 insulating plate
21 heatsink
22 circuit board (main wiring layer)
23 first conductive layer
24 second conductive layer
24a elongated part
24b elongated part
24c joining part
25 third conductive layer
25a elongated part
25b elongated part
26 gate wiring layer
27 auxiliary wiring layer
40 first bonding part (end)
41 second bonding part
42 joining part
50 insulating plate
51 gate wiring layer (wiring layer)
51a elongated part
51b elongated part
51c joining part
52 auxiliary wiring layer
52a elongated part
52b elongated part
52c joining part
52d wiring member
52e wiring member
53 chip resistor
A sense terminal
K sense terminal
S sense terminal
B bonding material
R bonding material
D1 gap
D2 gap
G1 gate lead (gate wiring member)
G2 gate lead (gate wiring member)
G3 gate lead (gate wiring member)
E1 auxiliary lead (auxiliary wiring member)
E2 auxiliary lead (auxiliary wiring member)
E3 auxiliary lead (auxiliary wiring member)
W sense lead

What is claimed is:

1. A semiconductor module, comprising:
a multilayer substrate having a main wiring layer formed therein, a main current flowing in the main wiring layer when the semiconductor module is turned on, the multilayer substrate further having another wiring layer;
a first semiconductor element and a second semiconductor element, each of which
has a top surface and a bottom surface that are opposite to each other,
has a top electrode disposed on the top surface thereof and a bottom electrode disposed on the bottom surface thereof, and
is disposed on the main wiring layer to which the bottom electrode is conductively connected;
a first metal plate having two end portions, one of the two end portions having a top surface and a bottom surface that are opposite to each other, the bottom surface being conductively connected to the top electrode of the first semiconductor element, the other one of the two end portions being connected to the another wiring layer via a bonding material;
a second metal plate having two end portions, one of the two end portions having a top surface and a bottom surface that are opposite to each other, the bottom surface being conductively connected to the top electrode of the second semiconductor element, the other one of the two end portions being connected to the another wiring layer via a bonding material;
a control board mounted only on the top surface of the one of the two end portions of the first metal plate; and
a chip resistor disposed on the control board, wherein
the control board includes
an insulating plate disposed on the top surface of the end portion, and
a control wiring layer for controlling turning on and off of the first and second semiconductor elements, and being disposed on the top surface of the insulating plate,
the first and second semiconductor elements each includes a gate electrode, and
the control wiring layer includes
a gate wiring member,
a gate wiring layer connected to the gate electrode of each of the first and second semiconductor elements through the gate wiring member,
an auxiliary wiring member, and
an auxiliary wiring layer connected to the top electrode of each of the first and second semiconductor elements through the auxiliary wiring member, the chip resistor being disposed on the auxiliary wiring layer.

2. The semiconductor module according to claim 1, wherein the first semiconductor element has a sensing function, and the control board is disposed directly above the first semiconductor element.

3. A semiconductor module, comprising:

a multilayer substrate having a main wiring layer formed therein, a main current flowing in the main wiring layer when the semiconductor module is turned on, the multilayer substrate further having another wiring layer;

a first semiconductor element and a second semiconductor element, each of which
- has a top surface and a bottom surface that are opposite to each other,
- has a top electrode disposed on the top surface thereof and a bottom electrode disposed on the bottom surface thereof, and
- is disposed on the main wiring layer to which the bottom electrode is conductively connected;

a first metal plate having two end portions, one of the two end portions having a top surface and a bottom surface that are opposite to each other, the bottom surface being conductively connected to the top electrode of the first semiconductor element, the other one of the two end portions being connected to the another wiring layer via a bonding material;

a second metal plate having two end portions, one of the two end portions having a top surface and a bottom surface that are opposite to each other, the bottom surface being conductively connected to the top electrode of the second semiconductor element, the other one of the two end portions being connected to the another wiring layer via a bonding material; and a control board mounted only on the top surface of the one of the two end portions of the first metal plate, wherein the control board includes
- an insulating plate disposed on the top surface of the end portion, and
- a control wiring layer for controlling turning on and off of the first and second semiconductor elements, and being disposed on the top surface of the insulating plate, the first and second semiconductor elements each includes a gate electrode, the control wiring layer includes
- a gate wiring member,
- a gate wiring layer connected to the gate electrode of each of the first and second semiconductor elements through the gate wiring member,
- an auxiliary wiring member, and
- an auxiliary wiring layer connected to the top electrode of each of the first and second semiconductor elements through the auxiliary wiring member, and the gate wiring layer and the auxiliary wiring layer each include a plurality of gate wiring parts and a plurality of auxiliary wiring parts that are alternately arranged.

4. The semiconductor module according to claim 3, wherein the first semiconductor element has a sensing function, and the control board is disposed directly above the first semiconductor element.

5. A semiconductor module, comprising:

a multilayer substrate having a main wiring layer formed therein, a main current flowing in the main wiring layer when the semiconductor module is turned on;

a first semiconductor element and a second semiconductor element, each of which
- has a top surface and a bottom surface that are opposite to each other,
- has a top electrode disposed on the top surface thereof and a bottom electrode disposed on the bottom surface thereof, and
- is disposed on the main wiring layer to which the bottom electrode is conductively connected;

a metal plate having an end portion, the end portion having a top surface and a bottom surface that are opposite to each other, the bottom surface thereof being conductively connected to the top electrode of the first semiconductor element; and a control board mounted on the top surface of the end portion, wherein the control board includes
- an insulating plate disposed on the top surface of the end portion, and
- a control wiring layer for controlling turning on and off of the first and second semiconductor elements, and being disposed on the top surface of the insulating plate, the first and second semiconductor elements each includes a gate electrode, the control wiring layer includes
- a gate wiring member,
- a gate wiring layer connected to the gate electrode of each of the first and second semiconductor elements through the gate wiring member,
- an auxiliary wiring member, and
- an auxiliary wiring layer connected to the top electrode of each of the first and second semiconductor elements through the auxiliary wiring member, the gate wiring layer has a gate input end, and first and second gate output ends branching out from the gate input end, the auxiliary wiring layer has an auxiliary input end, and first and second auxiliary output ends branching out from the auxiliary input end, the first gate output end is connected to the gate electrode of the first semiconductor element, the second gate output end is connected to the gate electrode of the second semiconductor element, the first auxiliary output end is connected to the top electrode of the first semiconductor element, and the second auxiliary output end is connected to the top electrode of the second semiconductor element.

6. The semiconductor module according to claim 5, wherein the gate electrode is disposed off-center of the semiconductor module near a periphery of each of the first and second semiconductor elements, the first and second semiconductor elements are disposed such that the respective gate electrodes face each other, and the first gate output end, the first auxiliary output end, the second gate output end, and the second auxiliary output end are provided at positions where the wiring members from each of the output ends to each of the semiconductor elements do not intersect.

7. The semiconductor module according to claim 6, wherein the control wiring layer on the insulating plate of the control board includes a plurality of layers that overlap one another in a depth direction.

* * * * *